United States Patent
Srivastava

(10) Patent No.: US 7,820,539 B2
(45) Date of Patent: Oct. 26, 2010

(54) METHOD FOR SEPARATELY OPTIMIZING SPACER WIDTH FOR TWO TRANSISTOR GROUPS USING A RECESS SPACER ETCH (RSE) INTEGRATION

(75) Inventor: Anadi Srivastava, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 497 days.

(21) Appl. No.: 11/364,985

(22) Filed: Feb. 28, 2006

(65) Prior Publication Data

US 2007/0202675 A1 Aug. 30, 2007

(51) Int. Cl.
*H01L 21/3205* (2006.01)
*H01L 21/4763* (2006.01)

(52) U.S. Cl. .............. 438/595; 257/E21.626; 257/E21.64

(58) Field of Classification Search ........... 438/197, 438/184, 230, 265, 300, 303, 595, 725, 735, 438/911; 257/E21.262, E21.626, E21.619, 257/900, E21.64
See application file for complete search history.

(56) References Cited

U.S. PATENT DOCUMENTS

| | | | |
|---|---|---|---|
| 6,169,017 B1 | 1/2001 | Lee | |
| 6,187,620 B1 * | 2/2001 | Fulford et al. | 438/230 |
| 6,194,279 B1 * | 2/2001 | Chen et al. | 438/303 |
| 6,316,304 B1 * | 11/2001 | Pradeep et al. | 438/230 |
| 6,461,951 B1 | 10/2002 | Besser et al. | |
| 6,509,264 B1 | 1/2003 | Li et al. | |
| 6,696,334 B1 * | 2/2004 | Hellig et al. | 438/230 |
| 6,746,927 B2 | 6/2004 | Kammler et al. | |
| 6,902,971 B2 * | 6/2005 | Grudowski | 438/218 |
| 6,943,077 B2 * | 9/2005 | Liu et al. | 438/230 |
| 2002/0160628 A1 * | 10/2002 | Okoroanyanwu et al. | 438/795 |
| 2003/0143792 A1 * | 7/2003 | Satoh et al. | 438/197 |
| 2004/0175890 A1 * | 9/2004 | Lee et al. | 438/275 |
| 2004/0222182 A1 * | 11/2004 | Perng et al. | 216/13 |
| 2005/0051866 A1 * | 3/2005 | Wang et al. | 257/510 |
| 2006/0094216 A1 * | 5/2006 | Nam | 438/595 |
| 2006/0148197 A1 * | 7/2006 | Wu et al. | 438/424 |
| 2007/0202643 A1 * | 8/2007 | Srivastava | 438/197 |
| 2007/0202675 A1 * | 8/2007 | Srivastava | 438/592 |

* cited by examiner

*Primary Examiner*—Matthew C Landau
*Assistant Examiner*—Latanya Crawford
(74) *Attorney, Agent, or Firm*—John A. Fortkort; Fortkort & Houston P.C.

(57) ABSTRACT

A method for making a semiconductor device is provided. In accordance with the method, a semiconductor structure is provided which comprises (a) a substrate (203), (b) first (219) and second (220) gate electrodes disposed over the substrate, and (c) first (223) and second (225) sets of spacer structures disposed adjacent to said first and second gate electrodes, respectively. A first layer of photoresist (231) is disposed over the structure such that the first set of spacer structures is exposed and the second set of spacer structures is covered. The structure is then subjected to an etch which etches the first layer of photoresist and a portion of the first and second sets of spacer structures.

24 Claims, 4 Drawing Sheets

METHOD FOR SEPARATELY OPTIMIZING SPACER WIDTH FOR TWO TRANSISTOR GROUPS USING A RECESS SPACER ETCH (RSE) INTEGRATION

FIELD OF THE DISCLOSURE

The present disclosure relates generally to semiconductor devices, and more particularly to processes for forming spacers in such devices.

BACKGROUND OF THE DISCLOSURE

Spacer width is a useful parameter for controlling parasitic source/drain resistance in transistors. Transistor operation is typically optimized with a spacer width that moves source/drain junctions closer to the channel without over-running source/drain extensions. In conventional semiconductor processes, however, a single spacer width is used for all transistor devices in a circuit. This width is usually dictated by the subset of transistor devices that have the highest impact on product constraints. However, independent control of spacer widths for different transistor groups is desirable because it enables more extensive optimization of each group, thereby resulting in better overall device performance.

There is thus a need in the art for a method for making transistors and other semiconductor devices which permits the independent optimization of spacer widths for two or more transistor groups. These and other needs may be met by the devices and methodologies described herein.

DETAILED DESCRIPTION

Figure 1:
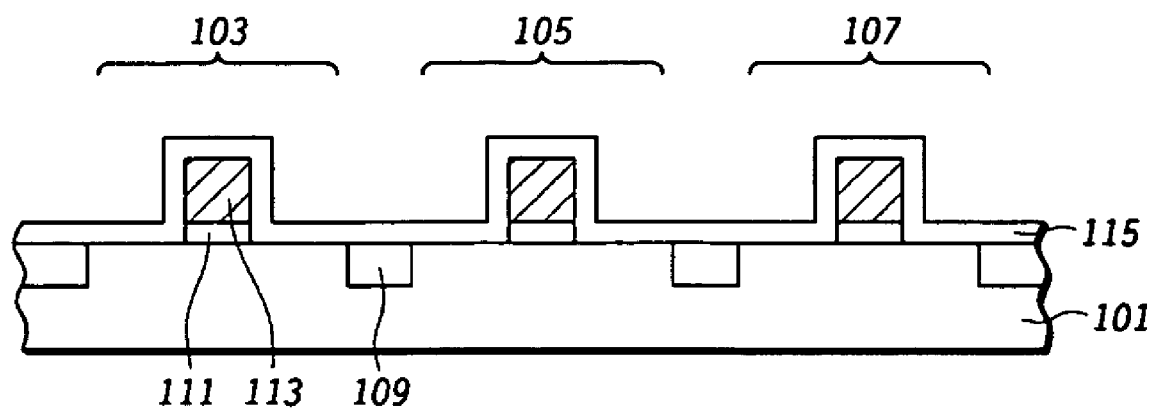
FIG. 1 is an illustration of one step in a prior art process for making spacer structures.

In one aspect, a method for making a semiconductor device is provided. In accordance with the method, a semiconductor structure is provided which comprises (a) a substrate, (b) first and second gate electrodes disposed over the substrate, and (c) first and second sets of spacer structures disposed adjacent to said first and second gate electrodes, respectively. A first layer of photoresist is disposed over the structure such that the first set of spacer structures is exposed and the second set of spacer structures is covered. The structure is then subjected to an etch which etches the first layer of photoresist and a portion of the first and second sets of spacer structures. The presence of the first layer of photoresist has the effect of delaying the onset of etching of the second set of spacer structures relative to the first set of spacer structures. This allows the formation of spacer structures having different dimensions, thereby permitting separate optimization of transistor performance in different transistor regions of the device.

In another aspect, a method for making a semiconductor device is provided. In accordance with the method, a semiconductor structure is provided which comprises a first transistor region comprising a first gate electrode and a first set of spacer structures disposed adjacent to the first gate electrode, and a second transistor region comprising a second gate electrode and a second set of spacer structures disposed adjacent to the second gate electrode. A first layer of photoresist is disposed over the structure such that the thickness of the photoresist in the first transistor region is $W_1$, and the thickness of the photoresist in the second transistor region is $w_2$, wherein $w_1 \neq w_2$. The structure is then subjected to a first etch which etches the first layer of photoresist and a portion of at least one of the first and second sets of spacer structures.

These and other aspects of the present disclosure are described in greater detail below.

It has now been found that a sacrificial photoresist layer may be utilized in conjunction with recess etching to create different recess depths and spacer widths on two or more transistor groups within a semiconductor device, thereby serving as a tool for transistor optimization. In accordance with this approach, a semiconductor device is provided which has at least first and second transistor regions defined thereon which are equipped, respectively, with first and second gate electrodes and first and second sets of spacer structures. The second transistor region is then covered with a sacrificial photoresist mask, while the first transistor region is left exposed.

The structure is then subjected to a recess etch which etches the sacrificial photoresist mask as well as the materials of the first and second spacer structures. The presence of the sacrificial photoresist has the effect of delaying the onset of etching of the second set of spacer structures relative to the first set of spacer structures. Hence, the recess etch achieved in the second transistor region is less than that achieved in the first transistor region, so that the first and second sets of spacer structures are of different dimensions. Since the thickness of the layer of photoresist in a given transistor region will typically have a direct effect on the spacer dimensions, it will be appreciated that the thickness of the photoresist layer may be modified as needed so as to achieve desired spacer dimensions and a desired recess depth in a given transistor region of a semiconductor device.

The methodologies described herein may be utilized to produce a desired recess depth and spacer dimensions for each group of transistors in a semiconductor device, so that silicidation and transistor performance is optimized for that group. A high degree of independent optimization can be achieved with this process for as many transistor groupings as desired. Thus, for example, this approach can be used to independently optimize different transistor classes such as NMOS/PMOS FETs, Symmetric/Asymmetric FETs, thin gate oxide /thick gate oxide FETs, floating body/body tied SOI FETs, or memory cache/logic groupings, thereby achieving improved performance optimization for each device set.

The methodologies described herein can be better understood in the context of the prior art process depicted in FIGS. 1-5 for producing devices with multiple spacer widths. Referring to FIG. 1, a substrate 101 is provided which contains a plurality of transistor regions 103, 105 and 107 thereon, each of which contains n and p wells (these have been omitted for simplicity of illustration). The transistor regions 103, 105, 107 are separated by shallow trench isolation regions 109. A bottom gate dielectric layer 111 and gate electrodes 113 are formed in each transistor region 103, 105, 107, and an oxide layer 115 is deposited on the substrate 101.

Figure 2:
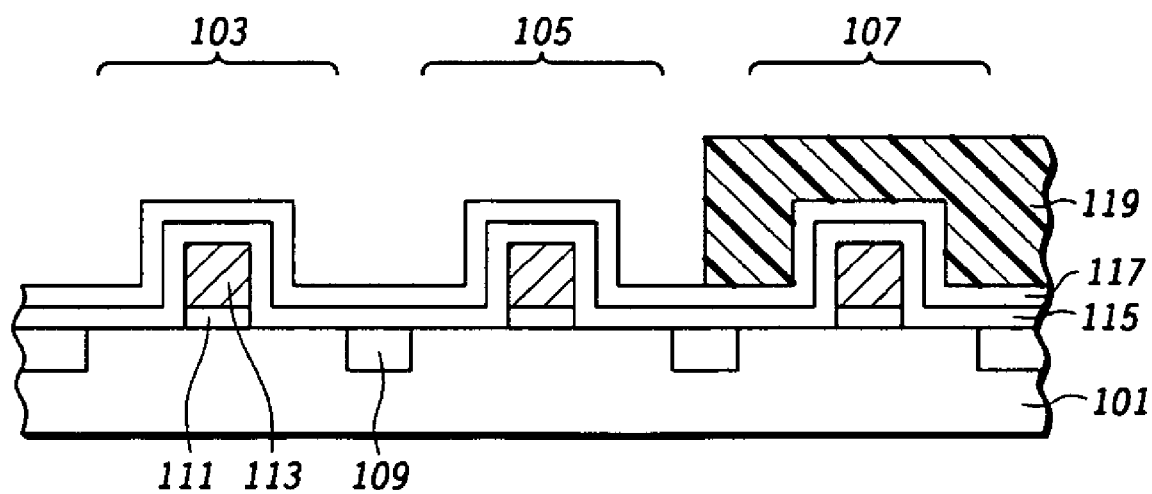
FIG. 2 is an illustration of one step in a prior art process for making spacer structures.

Referring to FIG. 2, a silicon nitride layer 117 is deposited on the oxide layer 115. The oxide layer 115 and silicon nitride layer 117 form a conformal coating on the gate electrodes 113 and on exposed portions of the substrate 101. A first photoresist mask 119 is formed in transistor region 107.

Figure 3:
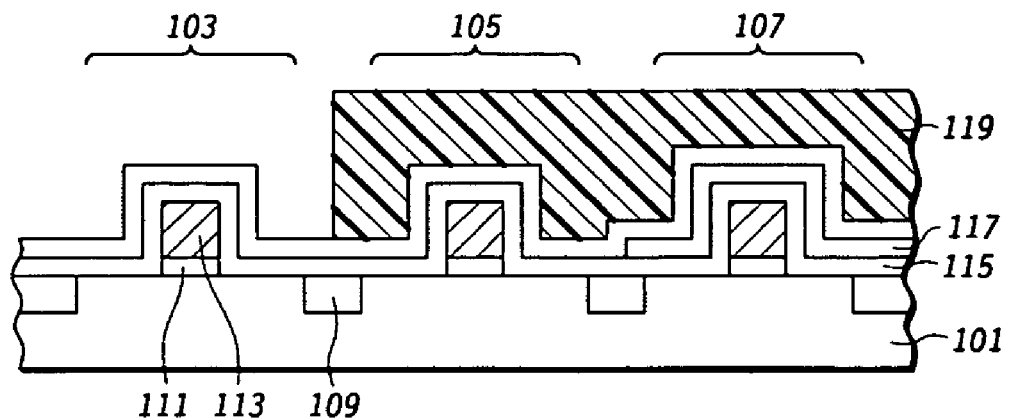
FIG. 3 is an illustration of one step in a prior art process for making spacer structures.

As shown in FIG. 3, the silicon nitride layer 117 is selectively removed from the transistor regions 103, 105 exposed by the first photoresist mask 119, after which the first photoresist mask 119 is stripped. A second silicon nitride layer 121 (with a similar thickness to silicon nitride layer 117) is then deposited as a conformal layer over the structure, after which a second photoresist mask 123 is formed over transistor regions 105, 107.

Figure 4:
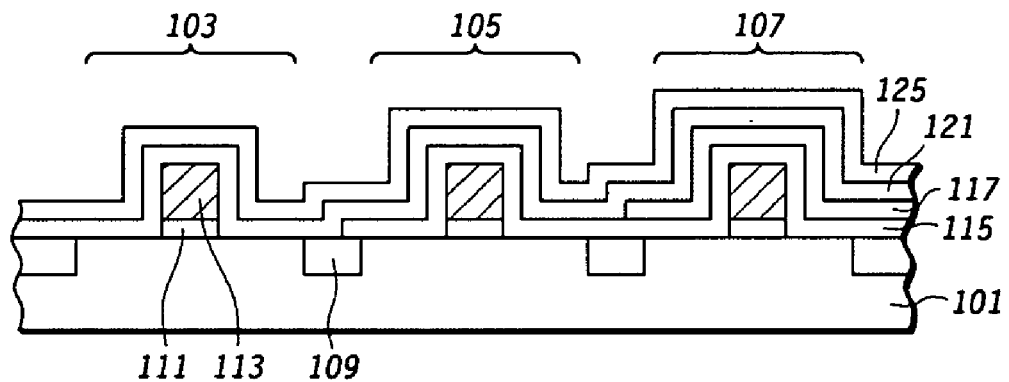
FIG. 4 is an illustration of one step in a prior art process for making spacer structures.

Referring to FIG. 4, the portion of the silicon nitride layer 121 in transistor region 103 which is exposed by the second photoresist mask 123 (see FIG. 3) is selectively removed, after which the second photoresist mask 123 is stripped. A third silicon nitride layer 125 (with a thickness similar to that of silicon nitride layer 117) is then deposited on substrate 101.

Figure 5:
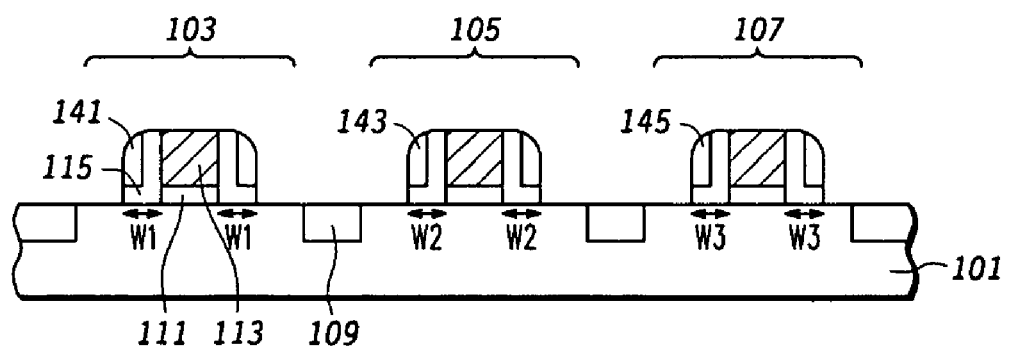
FIG. 5 is an illustration of one step in a prior art process for making spacer structures.

Referring to FIG. 5, an anisotropic etch is then utilized to produce silicon nitride spacers 141, 143 and 145 on the oxide layer 115 which is adjacent to the sidewalls of gate electrode 113 in transistor regions 103, 105, and 107, respectively. Since a single spacer etch is utilized, the same nitride etch conditions persist in each of the transistor regions 103, 105 and 107. However, since transistor region 105 has an additional silicon nitride layer 121 as compared to transistor region 103, and since transistor region 107 has an additional silicon nitride layer 125 as compared to transistor region 105 and has two additional silicon nitride layers 121 and 125 as compared to transistor region 103, the overetch results in different spacer widths $w_1$, $w_2$ and $w_3$ in transistor regions 103, 105 and 107, respectively, wherein $w_3 > w_2 > w_1$. Subsequent etching is performed to remove exposed portions of oxide layer 115, including portions of the oxide layer 115 above gate electrodes 113 and between nitride spacers 141, 143 and 145.

While the prior art process depicted in FIGS. 1-5 may ostensibly permit the formation of spacers which have different spacer widths in different transistor regions of a semiconductor device, it utilizes an unduly complex process to do so in that it requires the deposition of multiple layers of spacer material (and the associated masking and etching steps) to achieve the required number of layers of spacer material in each transistor region.

Figure 6:
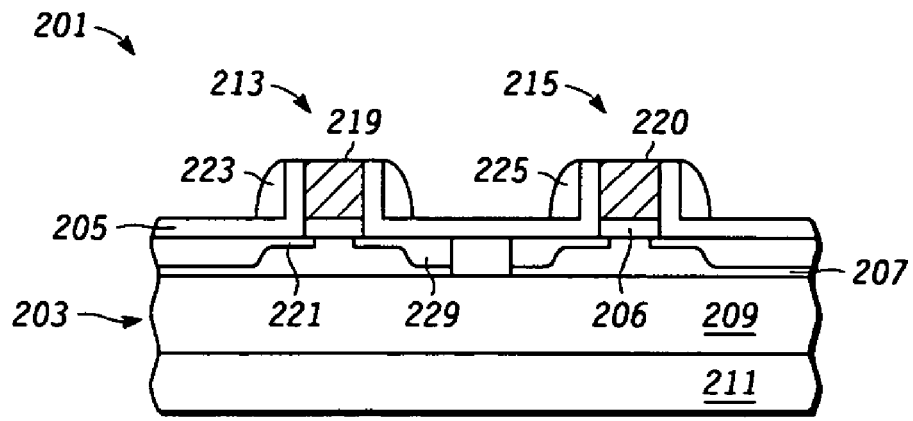
FIG. 6 is an illustration of one step in an embodiment of a process of the type described herein.

These shortcomings may be overcome by the methodologies described herein, a first, non-limiting embodiment of which is illustrated in FIGS. 6-9. With reference to FIG. 6, a semiconductor structure 201 is provided which comprises a semiconductor substrate 203 upon which is formed a dielectric layer 205 and a gate dielectric film 206. The gate dielectric film 206 may be, for example, a silicon dioxide film formed by the thermal oxidation of the upper surface of semiconductor substrate 203. Thermal oxidation of substrate 203 may be achieved, for example, by exposing the wafer to an oxidizing atmosphere (e.g., $O_2$, $H_2O$, or the like) at a temperature in excess of 900° C.

Typically, the gate dielectric 206 has a thickness of anywhere from about 15 to about 150 angstroms. In some embodiments, the gate dielectric 206 may be a "high K" dielectric having a dielectric constant K which is greater than 4.0. High K dielectrics are desirable for use in gate dielectric films to achieve sufficient capacitance with a thicker film. High K materials suitable for use as the gate dielectric 206 include various metal-oxide compounds such as hafnium-oxide, as well as other materials including aluminum oxide, hafnium silicate, zirconium silicate, hafnium aluminate, lanthanum aluminate, zirconium aluminate, and lanthanum oxide.

The upper portion of semiconductor substrate 203 typically includes a monocrystalline semiconductor material such as silicon on which the dielectric layer 205 and the gate dielectric 206 is formed. In one embodiment that is particularly suitable for use with low power applications such as mobile and wireless devices, semiconductor substrate 203 comprises a silicon-on-insulator (SOI) substrate in which the monocrystalline silicon 207 is a relatively thin film (i.e., less than 10,000 angstroms) and is formed over a buried oxide (BOX) 209 with a thickness roughly in the range of 1000 to 20,000 angstroms. The BOX 209 may, in turn, be formed over a handle wafer 211 or other substrate.

As seen in FIG. 6, two transistor devices 213 and 215 have been defined. These transistor devices 213, 215 comprise, respectively, gate electrodes 219 and 220 which are formed over the gate dielectric 206. Preferably, gate electrodes 219 and 220 are patterned from a polysilicon film. The gate electrodes 219 and 220 are typically patterned using photolithography and anisotropic or dry etch techniques that are well known in the art. The photolithography may include the use of an anti-reflective coating (ARC) and photoresist patterning techniques.

The polysilicon film from which the gate electrodes 219 and 220 may be patterned may be formed, for example, by the thermal decomposition of silane in a reactor chamber maintained at a temperature in the range of approximately 550-650° C. The polysilicon film is typically deposited as undoped silicon and is subsequently doped with an n-type (e.g., phosphorous, arsenic) or p-type (e.g., boron) dopant using ion implantation. The polysilicon film may be doped in-situ or by diffusion. In some embodiments, the gate electrodes 219 and 220 may also comprise such materials as germanium, tantalum silicon nitride, titanium nitride, molybdenum nitride or a combination thereof, either in addition to or in lieu of polysilicon.

One or more implant steps may be performed after forming gate electrodes 219 and 220 to introduce source/drain extension regions 221 into those portions of SOI layer 207 not covered by gate electrodes 219, 220. The source/drain extension regions 221 are desirable to control the threshold voltage and effective channel length of the resulting device.

Referring still to FIG. 6, first 223 and second 225 sets of spacer structures are formed adjacent to the gate electrodes 219 and 220. In some embodiments, the spacer film may comprise a low-K dielectric having a dielectric constant K of less than approximately 4.0. In other embodiments, the spacer film may comprise a film of chemically vapor deposited (CVD) silicon nitride, which may be formed, for example, by the reaction of dichlorosilane or silane with ammonia in a reactor maintained at a temperature within the range of 300° C. to 800° C. One example of suitable processing steps that may be used to form spacer structures is described, for example, in commonly assigned U.S. patent application Ser. No. 11/047,946, entitled "AYSMMETRIC SPACERS AND ASYMMETRIC SOURCE DRAIN EXTENSION LAYERS", Filed on Feb. 1, 2005 and incorporated herein by reference in its entirety.

A source/drain implant may be performed to introduce source/drain regions 229 in the form of impurity distributions in the SOI layer 207. The source/drain regions 229 are formed using gate electrodes 219, 220 and the spacer structures 223, 225 as implant masks such that the source/drain regions 229 that result are effectively self-aligned (prior to any diffusion steps) to spacer structures 223, 225. In an n-channel transistor embodiment, the source/drain implant 229 typically utilizes an n-type species such as phosphorous or arsenic, while in a p-channel transistor embodiment, the source/drain implant 229 typically uses boron or another p-type dopant. The implantation steps utilized to form the source/drain regions 229 and the source/drain extensions 221 will typically be followed by a thermal anneal to induce diffusion of the implant ions into the substrate 203. It is to be noted that, in some embodiments of the methodologies described herein, the source/drain implant step may be performed instead after the spacer structure depicted in FIG. 8 has been achieved.

Figure 7:
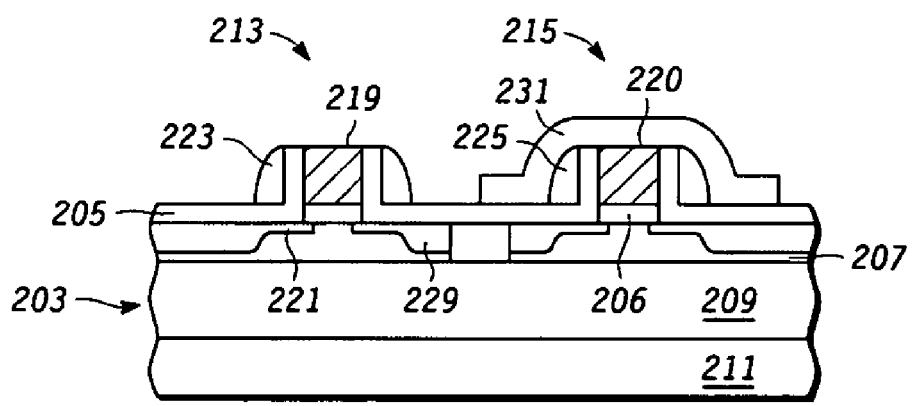
FIG. 7 is an illustration of one step in an embodiment of a process of the type described herein.
Figure 8:
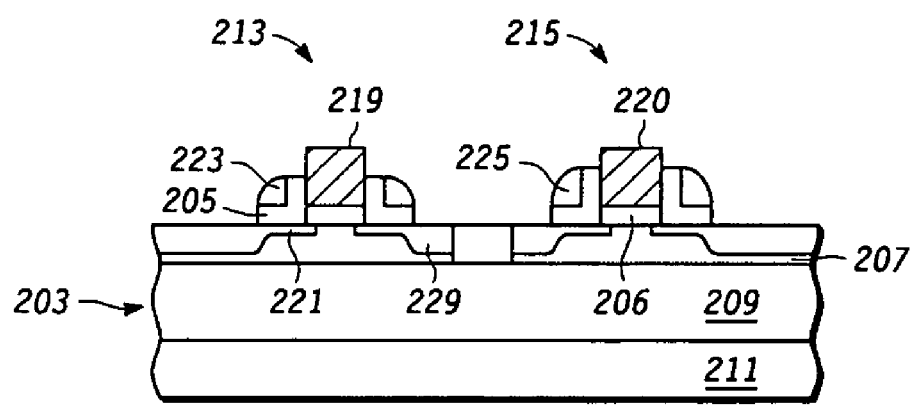
FIG. 8 is an illustration of one step in an embodiment of a process of the type described herein.

Referring now to FIG. 7, a sacrificial layer of photoresist 231 is then deposited over both devices and is patterned such that the second 215 transistor device is covered, and the first transistor device 213 is exposed. As seen in FIG. 8, the device is then subjected to an etch which etches the spacer structures 223 and 225 in transistor regions 213 and 215 of the structure, as well as the sacrificial layer of photoresist 231. Since the sacrificial layer of photoresist 231 effectively delays the onset of etching of the spacer structures 225 in the second transistor region of the device, the final dimensions of the spacer structures 225 in the second transistor region of the device are greater than the final dimensions of the spacer structures 223 in the first transistor region 213 of the device. It will be appreciated that, if the device contains additional transistor regions, further masking and etching steps could be utilized to adjust the spacer dimensions and/or recess depths in those regions. Similarly, the masking and etchings steps applied to the first and second transistor regions described above could also be applied to other transistor regions.

Figure 9:
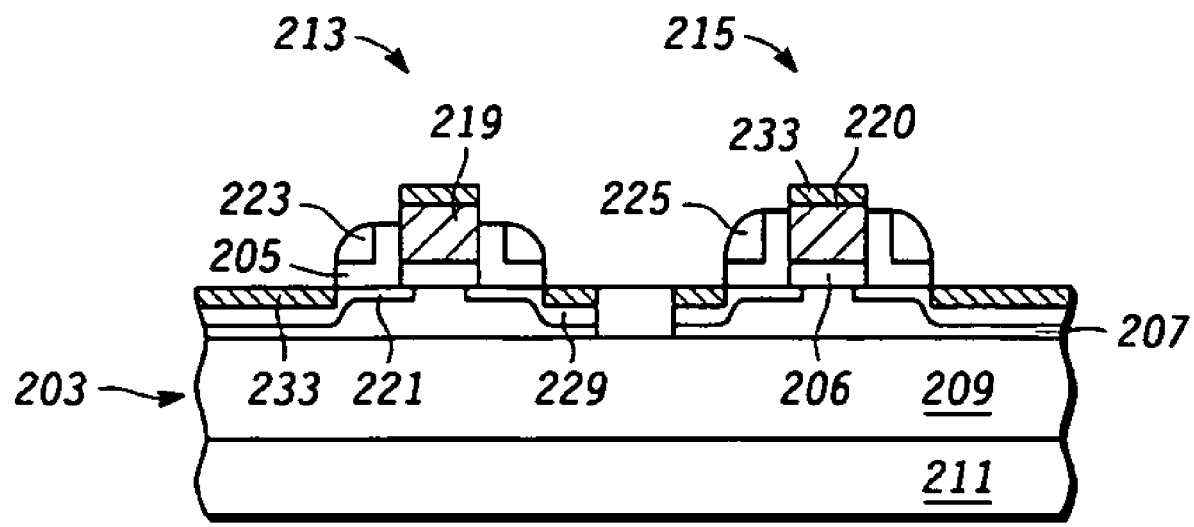
FIG. 9 is an illustration of one step in an embodiment of a process of the type described herein.

As shown in FIG. 9, any residual portion of the layer of photoresist 231 is then stripped with a suitable solvent, and the device is then subjected to a silicidation process to define silicide regions 233 over the gates 219, 220 and over the source and drain regions 229 of the device. In some embodiments, this step may be preceded by a dielectric etch to remove any exposed portions of the dielectric layer 205 disposed on the sides of the gate electrodes 219 or over the implant regions 229 that were not removed by the recess etch. The device may then be completed using processes well known in the art to define contacts and other elements of the device.

It will be appreciated from the foregoing that, in contrast to the prior art process depicted in FIGS. 1-5, the process of FIGS. 6-9 offers improved process simplicity. In particular, in order to achieve a structure with different spacer widths, the prior art process of FIGS. 1-5 requires an additional deposition step and an additional etch step for each additional spacer width desired, plus a global etch to realize the final spacer dimensions. By contrast, the process of FIGS. 6-9 can achieve a structure with different spacer widths using only one additional photomasking step for each additional spacer width (or recess depth) desired, and only one global etch to achieve the final spacer dimensions. As an added benefit, the recess etching described herein exposes additional surface area of the gate for silicidation, thereby allowing a uniform layer of silicide to be formed on a gate of smaller length than would otherwise be possible.

A number of modifications to the process described above are possible. In particular, it will be appreciated that, while the process has been specifically illustrated for the purposes of simplicity with respect to the fabrication of a device having only two transistor regions, with each transistor region having a single transistor device disposed therein, the method may be more generally applied to the fabrication of devices having any desired number of transistor regions, and each transistor region may have any number of transistor devices disposed therein.

Moreover, in some embodiments, each transistor region in the device may be covered by a layer of photoresist having a different thickness. Thus, if a semiconductor device contains n transistor regions, and the thickness of the photoresist in the $k^{th}$ region is $w_k$, then for any two regions $1 \leq i,j \leq n$, the respective photoresist thicknesses $w_i$ and $w_j$ of regions i and j may be the same or different. These thicknesses may be achieved by various deposition and/or etching processes.

It will also be appreciated that, while in some embodiments, the thickness of the photoresist layer may be used as the parameter that controls the extent of delay in the recess etch, in other embodiments, the chemistry of the photoresist layer may be used for this purpose. Thus, for example, the rate at which the layer of photoresist etches may varying depending on the concentration of a chemical compound or component in the photoresist, or the extent to which the layer of photoresist has been crosslinked. These parameters may be varied from one transistor region to another to control the etch rate of photoresist in that region, and therefore the extent of delay in the recess etch, whether or not the thickness of the layer of photoresist is the same for all transistor regions.

In some specific possible embodiments, different transistor regions of the device may be exposed for different amounts of time to a radiation source that induces crosslinking in the photoresist, with the result that the layer of photoresist in different transistor regions within the device differ have a different extent of crosslinking, and therefore different etch rates. In other specific embodiments, an impurity may be applied to the layer of photoresist, as through ion implantation, which slows down the etch rate of the photoresist, with the level or concentration of the impurity varying from one transistor region to another.

In still other embodiments, one or more sacrificial layers of photoresist may be used in combination with one or more sacrificial layers of a second material, such as an oxide or nitride, to delay the onset of recess etching, thereby producing different recess depths and/or spacer dimensions in different transistor regions of the device. For example, in a device having multiple transistor regions, various combinations of various numbers of layers of the photoresist and/or the second material (including the absence of either material) may be utilized in different transistor regions to achieve a desired delay in the onset of etching, thereby achieving desired recess depths and/or spacer dimensions in a given transistor region. In some variations of this type of embodiment, at least first and second recess etches may be utilized, and the second material may be resistant to one of the first and second recess etches but not the other.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
   providing a semiconductor structure comprising (a) a substrate, (b) first and second gate electrodes disposed over the substrate, and (c) first and second sets of spacer structures disposed adjacent to said first and second gate electrodes, respectively;

disposing a first layer of photoresist over the structure such that the first set of spacer structures is exposed and the second set of spacer structures is covered; and subjecting the structure to a first etch which etches the first layer of photoresist and a portion of the first and second sets of spacer structures.

2. The method of claim 1, wherein said first etch causes said first and second sets of spacer structures to be recessed with respect to said first and second gate electrodes, respectively.

3. The method of claim 1, further comprising the step of stripping any portion of the first layer of photoresist which remains on the substrate after the first etch.

4. The method of claim 1, further comprising the steps of subjecting the first and second gate electrodes to a silicidation reaction.

5. The method of claim 1, further comprising the step of forming implant regions adjacent to each of said first and second sets of spacer structures.

6. The method of claim 1 wherein, after the first etch, any remaining portion of the first layer of photoresist is removed from the structure, and the structure is subjected to a second etch.

7. The method of claim 5, wherein the implant regions define first source and drain regions adjacent to the first set of spacer structures, and wherein the first gate electrode, the first set of spacer structures and the first source and drain regions form a first transistor.

8. The method of claim 7, wherein the implant regions define second source and drain regions adjacent to the second set of spacer structures, and wherein the second gate electrode, the second set of spacer structures and the second source and drain regions form a second transistor.

9. The method of claim 8, further comprising the step of forming a layer of silicide over the source and drain regions of the first and second transistor.

10. The method of claim 8, wherein the first layer of photoresist covers the second transistor.

11. The method of claim 6, wherein the second etch is chemically distinct from the first etch.

12. A method for making a semiconductor device, comprising:

providing a semiconductor structure comprising (a) a first transistor region comprising a first gate electrode and a first set of spacer structures disposed adjacent to the first gate electrode;

(b) a second transistor region comprising a second gate electrode and a second set of spacer structures disposed adjacent to the second gate electrode;

disposing a first layer of photoresist over the structure such that the thickness of the photoresist in the first transistor region is $w_1$, and the thickness of the photoresist in the second transistor region is $w_2$, wherein $w_1 \neq w_2$; and subjecting the structure to a first etch which etches the first layer of photoresist and a portion of at least one of the first and second sets of spacer structures.

13. The method of claim 12, wherein the first etch etches a portion of each of the first and second sets of spacer structures.

14. The method of claim 12, wherein the first layer of photoresist contains a first substance that reduces the rate of etching of the photoresist with respect to the first etch, and wherein the concentration of the first substance in the first transistor region is less than the concentration of the first substance in the second transistor region.

15. The method of claim 12, wherein $w_1, w_2 > 0$.

16. The method of claim 12, wherein further comprising the step of forming implant regions adjacent to each of said first and second sets of spacer structures.

17. The method of claim 16, wherein the implant regions define first source and drain regions adjacent to the first set of spacer structures, and wherein the implant regions define second source and drain regions adjacent to the second set of spacer structures.

18. The method of claim 17, further comprising the step of forming a layer of silicide over the source and drain regions in the first and second transistor regions.

19. A method for making a semiconductor device, comprising:

providing a semiconductor structure comprising (a) a first transistor region comprising a first gate electrode and a first set of spacer structures disposed adjacent to the first gate electrode; (b) a second transistor region comprising a second gate electrode and a second set of spacer structures disposed adjacent to the second gate electrode;

disposing a first layer of photoresist over the structure such that the thickness of the photoresist in the first transistor region is $w_1$, and the thickness of the photoresist in the second transistor region is $w_2$, wherein $w_1 \neq w_2$; and subjecting the structure to a first etch which etches the first layer of photoresist and a portion of at least one of the first and second sets of spacer structures;

wherein the first layer of photoresist contains a first substance that reduces the rate of etching of the photoresist with respect to the first etch, and wherein the concentration of the first substance in the first transistor region is less than the concentration of the first substance in the second transistor region.

20. The method of claim 19, wherein the first etch etches a portion of each of the first and second sets of spacer structures.

21. The method of claim 19, wherein the implant regions define first source and drain regions adjacent to the first set of spacer structures, and wherein the implant regions define second source and drain regions adjacent to the second set of spacer structures.

22. The method of claim 19, wherein $w_1, w_2 > 0$.

23. The method of claim 19, wherein further comprising the step of forming implant regions adjacent to each of said first and second sets of spacer structures.

24. The method of claim 21, further comprising the step of forming a layer of silicide over the source and drain regions in the first and second transistor regions.

* * * * *